US010048335B2

(12) United States Patent
Matsunaga et al.

(10) Patent No.: US 10,048,335 B2
(45) Date of Patent: Aug. 14, 2018

(54) COIL ASSEMBLY FOR ACCURATE ADJUSTMENT OF MAGIC ANGLE IN SOLID-STATE NMR APPARATUS AND METHOD OF ADJUSTING MAGIC ANGLE USING SUCH COIL ASSEMBLY

(71) Applicant: JEOL Ltd., Tokyo (JP)

(72) Inventors: Tatsuya Matsunaga, Kyoto (JP); Kiyonori Takegoshi, Kyoto (JP); Takashi Mizuno, Tokyo (JP)

(73) Assignee: JEOL Ltd., Tokyo (JP)

( * ) Notice: Subject to any disclaimer, the term of this patent is extended or adjusted under 35 U.S.C. 154(b) by 282 days.

(21) Appl. No.: 15/079,422

(22) Filed: Mar. 24, 2016

(65) Prior Publication Data

US 2016/0291102 A1  Oct. 6, 2016

(30) Foreign Application Priority Data

Mar. 31, 2015 (JP) ................................. 2015-071171

(51) Int. Cl.
| | |
|---|---|
| *G01R 33/38* | (2006.01) |
| *G01R 33/30* | (2006.01) |
| *G01R 33/389* | (2006.01) |
| *G01R 33/44* | (2006.01) |
| *G01R 33/46* | (2006.01) |
| *G01R 33/565* | (2006.01) |
| G01R 33/3875 | (2006.01) |

(52) U.S. Cl.
CPC ............ *G01R 33/38* (2013.01); *G01R 33/307* (2013.01); *G01R 33/389* (2013.01); *G01R 33/445* (2013.01); *G01R 33/46* (2013.01); *G01R 33/56563* (2013.01); G01R 33/3875 (2013.01)

(58) Field of Classification Search
None
See application file for complete search history.

(56) References Cited

U.S. PATENT DOCUMENTS

| | | | |
|---|---|---|---|
| 8,547,099 B2 | 10/2013 | Takegoshi et al. | |
| 2011/0080171 A1* | 4/2011 | Takegoshi ............ | G01R 33/307 324/318 |

FOREIGN PATENT DOCUMENTS

JP  5445754 B2  3/2014

OTHER PUBLICATIONS

Optimum Geometry of Saddle Shapped Coils for Generating a Uniform Magnetic Field, Sep. 1969) by Ginsberg et al.*

* cited by examiner

*Primary Examiner* — Paresh Patel
(74) *Attorney, Agent, or Firm* — The Webb Law Firm

(57) ABSTRACT

A specially shaped coil assembly for accurate adjustment of the magic angle is provided to permit accurate adjustment of an angle made between the direction of a static magnetic field and the axis of sample spinning without impairing the resolution of NMR signals. The sample is placed within the external static magnetic field $B_0$. The coil assembly is for use in a solid-state NMR apparatus that performs NMR detection while spinning the sample about an axis tilted at the magic angle relative to the external static magnetic field $B_0$. The coil assembly comprises a pair of arcuate conductor lines and a pair of straight conductor lines. Each of the arcuate lines has a diameter of 2a. Each of the straight lines has a length of 2L. The diameter 2a and the length 2L are so selected as to satisfy the relationship: $1.91 \leq 2L/2a \leq 2.15$.

4 Claims, 12 Drawing Sheets

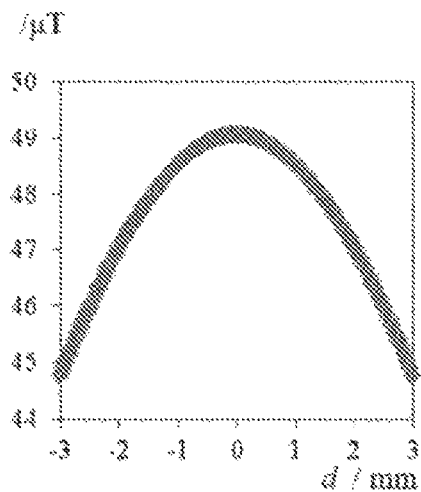
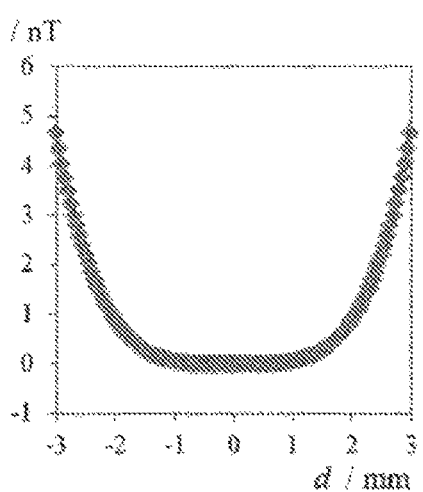
FIG. 5A  FIG. 5B
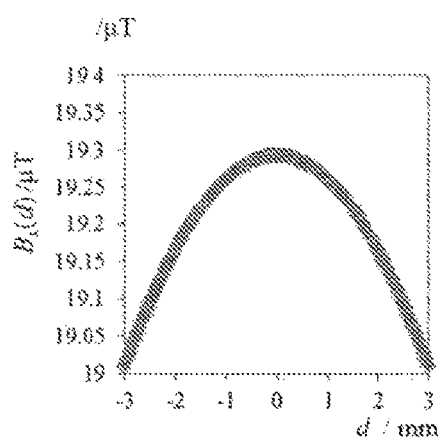
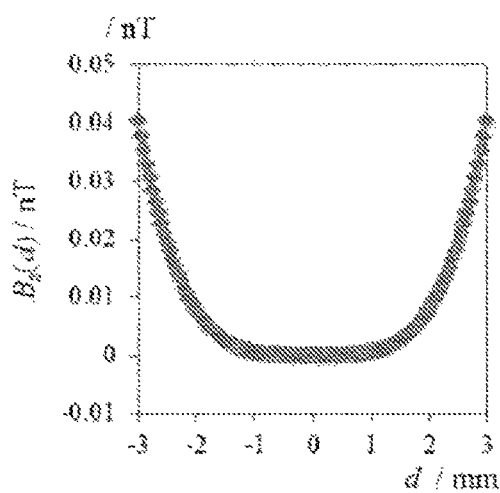
FIG. 6A  FIG. 6B

COIL ASSEMBLY FOR ACCURATE ADJUSTMENT OF MAGIC ANGLE IN SOLID-STATE NMR APPARATUS AND METHOD OF ADJUSTING MAGIC ANGLE USING SUCH COIL ASSEMBLY

1. FIELD OF THE INVENTION

The present invention relates to a nuclear magnetic resonance (NMR) apparatus, and more particularly to an NMR apparatus capable of investigating a solid sample at high resolution while spinning the sample at the magic angle. Still more particularly, the invention relates to an NMR apparatus having a coil assembly for electrically adjusting the magic angle.

2. DESCRIPTION OF THE RELATED ART

In an NMR apparatus, a sample is placed within a uniform static magnetic field. Pulsed RF waves having the resonance frequency of nuclei to be investigated are applied to the sample from a direction perpendicular to the static magnetic field to induce a nuclear magnetic resonance. A signal based on the resonance is detected to obtain an NMR spectrum.

Where an NMR measurement of a solid powdered sample is made, shifts of resonance lines due to anisotropy of internal interactions of nuclear spins must be taken into account, unlike the case where an NMR measurement of a solution sample is made. For example, the magnitude of magnetic shielding varies according to an electron density distribution that is a chief factor causing chemical shift interactions and, therefore, resonance line shifts occur according to the orientation made by the external magnetic field and the principal molecular axis system that is set along the coupling direction. In a solid powdered sample, crystallites to which individual molecules having the same molecular axis system belong assume a random spatial arrangement relative to the external magnetic field. Therefore, the resulting NMR resonance lines are a broad resonance line corresponding to the spatial integral of resonance line shifts of the individual crystallites. Consequently, when a solid-state NMR measurement of a sample is performed in a general manner while holding the sample stationary, a broad resonance line spectrum is obtained in which many kinds of chemical species contained in the sample overlap each other. Thus, high resolution is not achieved.

Assume that the direction of the external static magnetic field is indicated by z. The anisotropic effects of internal interactions of nuclear spins can be removed by artificially creating a circumstance in which the sample can feel the x, y, z axes equivalently on a time-averaged basis, by spinning the sample about an axis tilted in the (111) direction (i.e., at about 54.7 degrees) with respect to the static magnetic field. Thus, it is possible to obtain a high-resolution spectrum in which resonance lines consisting of numerous chemical shifts are separated. This is the basic idea of the magic-angle sample spinning (MAS). It should be said that this is the essential condition of solid-state high-resolution NMR measurements.

The manner as to how this magic-angle sample spinning is implemented in NMR instrumentation is next described. FIG. 18 shows a conventional solid-state high-resolution NMR apparatus.

In FIG. 18, a superconducting magnet 0 has a vertically placed solenoid coil 1 having windings of superconducting wire within a cryostat filled with liquid helium. A uniform, vertical, external static magnetic field is produced in the center of this solenoid coil 1. To utilize this field, the cryostat has a bore 2 partitioned by a cylinder forming a partition wall inside the solenoid coil 1. The interior space of the bore 2 is at room temperature and atmospheric pressure.

An NMR probe 3 holds the sample, applies RF waves to it, and detects a signal arising from the sample. The probe 3 is withdrawably inserted into the bore 2 from outside of the superconducting magnet 0. Therefore, the NMR probe 3 has a front-end shape (normally, a cylindrical shape) suitable for insertion into the bore 2. The probe 3 has a sample spinning mechanism for placing the sample at a heightwise position where the sample feels the uniform magnetic field generated by the superconducting magnet when the mechanism is installed and for spinning the sample at high speed. Furthermore, the probe 3 has a transmit/receive coil for exciting and detecting an NMR signal.

One example of the sample spinning mechanism is shown in FIG. 19, where a sample tube 4 in which a sample is sealed is held by an air bearing. Blades 8 are mounted over the sample tube. An air stream is blown against the blades 8 from a turbine nozzle 9 mounted around the blades 8, whereby the sample can be spun. In a normal sample spinning mechanism, compressed air lower than 10 atm. is used and supplied through piping disposed in the bottom of the probe as shown in FIG. 18.

FIG. 20 shows one example of a mechanism for mechanically adjusting the axis of the sample spinning to the magic angle relative to the direction of the static magnetic field. In FIG. 20, the sample spinning mechanism shown in FIG. 19 excluding the sample tube 4 is assembled as a stator tube 5 into one unit. An angle varying mechanism 10, a shaft 11, a coupling 14, flexible wire 13, and an angle controller 12 are mounted to the stator tube 5. The angle made between the axis of sample spinning and the external static magnetic field $B_0$ is adjusted by mechanically rotating the stator tube 5 about an axis perpendicular to the axis of sample spinning and to the static magnetic field through these components 10, 11, 14, 13, and 12 under the control of a main controller 15.

It is possible to bring the angle formed between the axis of sample spinning and the direction of the static magnetic field into coincidence with the magic angle, for example, by varying the direction of the axis of sample spinning using such an angle adjusting mechanism while performing an NMR measurement of a reference sample so as to achieve an angle leading to a maximum resolution. However, the setting accuracy has not been always satisfactory for the following reason. Each component constituting the angle varying mechanism is segmented into parts and so error effects caused by deformations of the individual parts and backlash of toothed wheels will overlap. Therefore, it has been difficult to set the angle at an accuracy of, for example, within 0.001°.

On the other hand, a technique of bringing the angle made between the axis of sample spinning and the direction of the static magnetic field into coincidence with the magic angle at high accuracy by electrically varying the direction of the static magnetic field instead of mechanically varying the direction of the axis of sample spinning is proposed in Japanese Patent No. 5,445,754. FIG. 21 is a diagram illustrating the principle of this technique.

In FIG. 21, the direction of an external static magnetic field $B_0$ is indicated by z. Directions perpendicular to the direction z are indicated by y and x, respectively. If the axis of spinning of a sample tube 21 is in the z-y or z-x plane, a saddle type coil 22 having an axis lying in the direction y or x in the z-y or z-x plane is installed. If a uniform magnetic field in the direction y or x is produced in the center of a sample by supplying electric current into the saddle type coil, the external magnetic field felt by the sample is tilted in the direction of a static magnetic field $B_0'$ that is a vectorial combination of the external static magnetic field $B_0$ and the uniform magnetic field in the y or x direction. Therefore, the angle θ made between the axis of sample spinning and the resultant magnetic field $B_0'$ can be controlled while maintaining the axis of sample spinning unchanged.

The uniform magnetic field in the y or x direction can be controlled continuously with good stability in the same way as for ordinary room-temperature shim coils by supplying electric current into the saddle type coil from a current regulated power supply having a sufficiently high degree of stability.

CITATION LIST

Patent Documents

Patent document 1: Japanese Patent No. 5,445,754

In the conventional technique set forth in patent document 1, a composite static magnetic field is produced at the position of the sample space within a solid NMR probe by combining the external static magnetic field $B_0$ and the variable uniform magnetic field produced within a plane perpendicular to the static field $B_0$. Therefore, the angle made between the axis of sample spinning and the composite static magnetic field can be controlled accurately based on electrical control.

In this conventional technique, a Helmholtz saddle coil is used to produce the variable uniform magnetic field. The current component flowing through this saddle coil includes a current component (arcuate component) perpendicular to the static magnetic field that is outside of the saddle coil. The latter current component (arcuate component) induces a magnetic field in the z direction in a space around the center of the magnetic field. The space is a sphere which has a radius of about 2.3 mm and which is centered at the center of the Helmholtz saddle coil. By the effects of the induced magnetic field, frequency shifts of nuclear spin resonance lines occur. This may degrade the resolution of the NMR spectrum.

The relationship between the resolution of an NMR spectrum and the above-described frequency shifts is now described. By "resolution" is meant herein is the degree to which resonance lines can be separated. The resolution is one index indicative of the performance of the NMR apparatus, and is expressed as a ratio of the full width at half maximum (so-called linewidth in frequency) of NMR resonance lines of a reference compound (such as a $^1$H-NMR spectrum of tetramethylsilane) to the carrier frequency of the nuclear species of interest (in this case, the carrier frequency of $^1$H-NMR). Generally, artifacts affecting the resolution of an NMR apparatus are frequency shifts based on temporal inhomogeneity due to perturbations of the external static magnetic field and on spatial inhomogeneity of the external static magnetic field caused by variations in the magnetic susceptibility of members surrounding the sample space. That is, if these artifacts produce large effects, nuclear spins of the same type present within the same sample will feel spatially and temporally subtly different magnetic fields. Frequency shifts of resonance lines occur in the resulting spectrum in response to such inhomogeneities, whereby the resonance lines overlap. As a result, the resolution is impaired.

Dimensions and shape of a saddle coil which minimize such frequency shifts are unavailable in the prior art. Rather, in the conventional technique, characteristic numerical value ranges defining the dimensions and shape of a saddle coil are set forth in claim 6 of the above-cited patent document 1 as follows: "In the case of a wide bore, the diameter of the saddle coil is 72.0±0.5 mm or less and, in the case of a narrow bore, the diameter is 46.0±0.5 mm or less. The ratio between the diameter and height of the coil is $\sqrt{2}:1$."

Observations made by us have shown that, under the conditions of dimensions and shape presented as described above, the saddle coils produce undesirable frequency shifts and the effects on the resolution of NMR resonance lines are not reduced to a minimum.

SUMMARY OF THE INVENTION

It is an object of the present invention to provide dimensions and shape that are optimized for the Helmholz saddle coil used in the prior art. It is another object to provide a method of adjusting the magic angle using this novel Helmholtz saddle coil.

(A1) A coil assembly according to a first embodiment of the present invention to make an accurate adjustment of the magic angle is used in a solid-state NMR apparatus where a sample is placed in an external static magnetic field $B_0$. The apparatus performs NMR detection while spinning the sample at high speed about an axis tilted at the magic angle relative to the external static magnetic field $B_0$. The coil assembly is made of a pair of Helmholtz saddle coils which are arranged symmetrically with respect to a z axis of an xyz coordinate system on a cylindrical plane having a radius of a and centered at the z axis to produce a uniform magnetic field in the direction of an x axis when the axis of spinning of the sample is tilted relative to the z axis within a z-x plane. The external static magnetic field $B_0$ lies along the z axis. Each of the Helmholtz coils has a plurality of turns. Each turn of the coils is composed of a pair of arcuate conductor lines arranged circumferentially of the cylindrical plane and a pair of straight conductor lines arranged lengthwise of the cylindrical plane and interconnecting the arcuate conductor lines. Each of the arcuate conductor lines has a diameter of 2a. Each of the straight conductor lines has a length of 2L. The diameter 2a of each arcuate conductor line and the length 2L of each straight conductor line are so selected as to satisfy the following relationship:

1.91≤2L(length)/2a(diameter)≤2.15

(A2) In one feature of the coil assembly as set forth in (A1) above, the diameter 2a of each arcuate conductor line and the length 2L of each straight conductor line are so selected as to satisfy the following relationship:

1.99≤2L(length)/2a(diameter)≤2.02

(A3) A method of adjusting the magic angle in a solid-state NMR apparatus equipped with a coil assembly as set forth in (A1) above and used for accurate adjustment of the magic angle starts with placing a sample within an external static magnetic field $B_0$. An NMR measurement is made while spinning the sample at high speed about an axis tilted at a given angle relative to the external static magnetic field $B_0$ and at the same time varying an electric current supplied into the coil assembly. An NMR signal is detected. A state in which a rotational echo signal appearing in the detected NMR signal decays most slowly is found. The current supplied into the coil assembly under this found state is taken as an optimum current, and this optimum current is supplied into the coil assembly.

(A4) Another method of adjusting the magic angle is implemented in a solid-state NMR apparatus equipped with a coil assembly which is based on (A1) above and which is for accurate adjustment of the magic angle. This method starts with placing a sample within an external static magnetic field $B_0$. An NMR measurement is performed while spinning the sample at high speed about an axis tilted at a given angle relative to the external static magnetic field $B_0$ and at the same time varying an electric current supplied to the coil assembly for accurate adjustment of the magic angle. An NMR signal is detected. An NMR spectrum is generated based on the NMR signal. A state in which spinning sidebands appearing in the NMR spectrum maximize is found. The current supplied into the coil assembly under this found state is taken as an optimum current, and this optimum current is supplied into the coil assembly.

The present invention yields the following advantages.

(1) According to the first embodiment set forth in (A1) above, the length and diameter defining the shape of the Helmholtz saddle coils used as a coil assembly for accurate adjustment of the magic angle are so chosen as to satisfy the relationship, 1.91≤2L (length)/2a (diameter)≤2.15. As a result, a coil assembly for accurate adjustment of the magic angle can be provided which avoids increases in linewidths and can minimize the effects on the resolution of NMR resonance lines.

(2) According to the embodiment set forth in (A2) above, the length and diameter defining the shape of the Helmholtz saddle coils used as a coil assembly for accurate adjustment of the magic angle are so chosen as to satisfy the relationship, 1.99≤2L (length)/2a (diameter)≤2.02. As a result, a coil assembly for accurate adjustment of the magic angle can be provided which avoids increases in linewidths and can minimize the effects on the resolution of NMR resonance lines.

(3) The embodiments set forth respectively in (A3) and (A4) provide a method of adjusting the magic angle, the method being implemented in a solid-state NMR apparatus equipped with a coil assembly according to (A1) for accurate adjustment of the magic angle. This method can determine an optimum current supplied into the coil assembly for accurate adjustment of the magic angle.

BRIEF DESCRIPTION OF THE DRAWINGS

FIGS. 5A and 5B show graphs in which the dependences of magnetic fields $B_z$ and $B_x$ produced by a single-turn Helmholtz saddle coil on the axis of spinning d of the sample tube are plotted.

FIGS. 6A and 6B show graphs in which the dependences of magnetic fields $B_z$ and $B_x$ produced by the single-turn Helmholtz saddle coil on the axis of spinning d of the sample tube are plotted.

DESCRIPTION OF THE PREFERRED EMBODIMENTS

Figure 1:
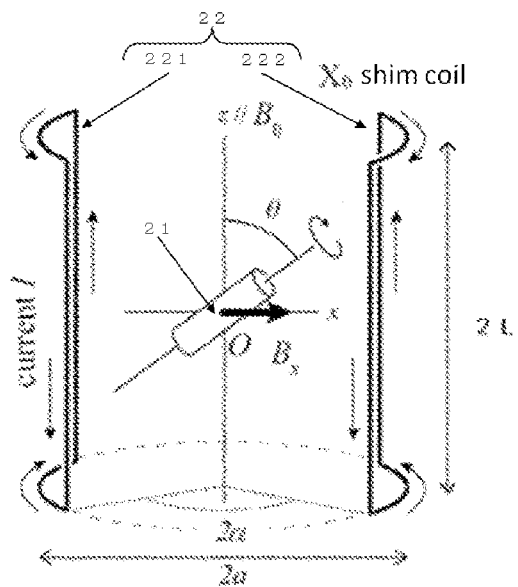
FIG. 1 is a conceptual diagram of a coil assembly based on the present invention for accurate adjustment of the magic angle.
Figure 21:
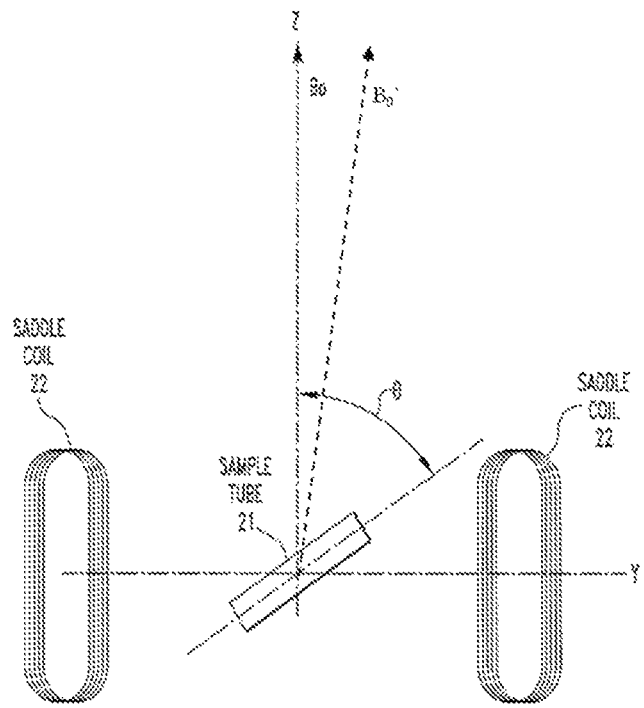
FIG. 21 is a schematic representation illustrating the principle of a known technique.

The preferred embodiments of the present invention are hereinafter described in detail by referring to the accompanying drawings. FIG. 1 is a conceptual diagram of a coil assembly fabricated in accordance with the present invention for accurate adjustment of the magic angle. FIG. 1 more specifically shows the shape of the saddle coil 22 of FIG. 21 and the positional relationship of this coil 22 with the sample.

Referring to FIG. 1, a uniform static magnetic field $B_0$ is produced inside a superconducting magnet in the z direction (up-down direction). The cylindrical sample tube 21 is placed in the center O of the field at an angle θ relative to the static magnetic field. The sample tube 21 is spun about the tilted axis at high speed.

As shown in FIG. 1, a direction perpendicular to the z direction is taken as the x direction. It is assumed that the axis of spinning of the sample tube 21 lies within the z-x plane. Coil elements 221 and 222 of one pair which constitute the solenoid saddle coil 22 are arranged symmetrically about the sample tube 21 and the z axis. Since the solenoid saddle coil 22 applies an additive magnetic field in the x direction, this saddle coil 22 is herein referred to as the $X_0$ shim coil.

The $X_0$ shim coil 22 is composed of two (upper and lower) arcuate conductor lines formed on the surface of the cylindrical bobbin having a radius of a and two straight conductor lines interconnecting the arcuate conductor lines. The two straight conductor lines extend axially of the cylindrical bobbin. The arcuate conductor lines extend circumferentially of the cylindrical bobbin. A uniform magnetic field $B_x$ lying in the x direction is generated in the space where the sample tube exists by causing the same electric current to flow through the arcuate conductor lines and the straight conductor lines in the directions indicated by the arrows.

Referring still to FIG. 1, each of the straight conductor lines is herein defined to have a length of 2L, which is equal to the height of the $X_0$ shim coil. That is, L is the half height of the shim coil. The spacing 2a between the arcuate conductor lines that are located on the opposite sides of the z axis is equal to the diameter of the $X_0$ shim coil. That is, a is the radius of the shim coil. As also shown in FIG. 1, angle $2\alpha$ between the opposite straight conductor lines as measured about the z axis is defined as the angular aperture of the $X_0$ shim coil. Note that L may be written in cursive letters in diagrams, tables, and formulas.

The $X_0$ shim coil configured as described above is a Helmholtz saddle coil having plural turns and has a diameter smaller than the inside diameter of the bore of a commercially available superconducting magnet for a high-resolution NMR spectrometer. The saddle coil is arranged vertically symmetrically about the center of the magnetic field, and is secured to the outer surface of a cylindrical holding unit equipped inside the bore. Two examples of the configuration for installing the $X_0$ shim coil inside the bore of the superconducting magnet are given below.

Figure 2:
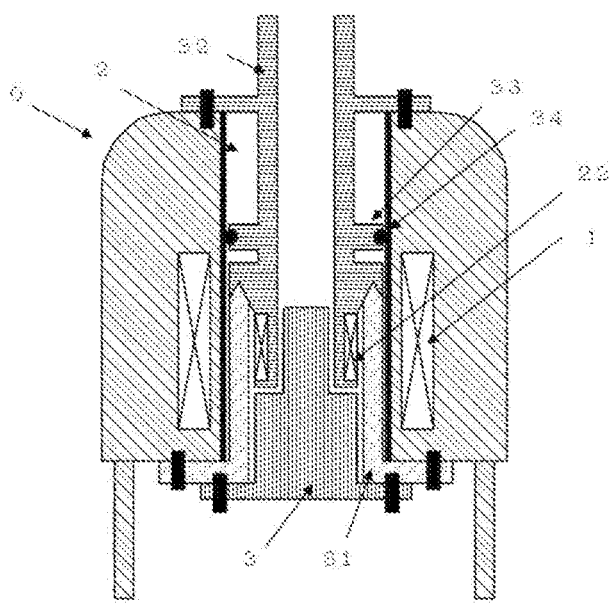
FIG. 2 is a vertical cross section of a configuration for mounting an $X_0$ shim coil in a bore of a superconducting magnet.

In the first example, the $X_0$ shim coil is mounted to the outer surface of a probe using a retainer. The cross section of FIG. 2 shows the manner in which the coil has been mounted on a magnet. In FIG. 2, a room-temperature shim unit 31 incorporates therein plural shim coils for optimizing the spatial homogeneity of the strength of the static magnetic field around the center of the magnetic field and electric circuitry for supplying electric currents to the shim coils. The room-temperature shim unit 31 has a front end portion in the form of a hollow cylinder and a base portion at its lower end, the base portion having a flange. The shim unit is so placed that the front end portion is inserted into the bore from the opening end of the bore being in a lower part of the magnet and that the top end is located above the center of the magnetic field. The shim unit is bolted at this flange to the bottom flanged surface of the magnet.

The NMR probe (MAS probe) 3 incorporates therein a magic angle sample spinning mechanism for spinning the solid sample about an axis tilted at an angle nearly equal to the magic angle from the static magnetic field. Furthermore, the probe 3 has circuitry for applying an RF magnetic field to the sample and detecting the resulting NMR signal. The NMR probe 3 has a cylindrical front end portion and a base portion including a flange at its lowermost end. The front end portion is inserted into the bore from the opening end of the room-temperature shim unit 31 that is held to a lower portion of the magnet. A rotating mechanism and a sample placed in it are brought into the center of the magnetic field. The probe is bolted to the bottom flanged surface of the room-temperature shim unit 31.

A retainer 32 is used to hold the $X_0$ shim coil 22 to the magnet. The retainer is a hollow cylinder in shape and has a flange at its upper periphery. The retainer holds the shim coil 22 at the outer periphery located at its lower end. The retainer 32 is inserted into the bore 2 from the bore opening end in an upper portion of the magnet, and is placed such that the shim coil 22 is located near the center of the magnetic field between the room-temperature shim unit and the MAS probe 3. The shim coil is bolted to the top flanged surface of the magnet at the upper flange.

The lower end portion of the retainer 32 is inserted close to the center of the magnetic field from the bore opening end at the top of the magnet in this way. The lower end portion of the retainer 32 is pressed against and connected to a topmost end of the room-temperature shim unit 31 that is inserted upwardly from the bore opening end at the bottom of the magnet. The retainer 32 has a jaw portion 33 whose diameter increases such that the jaw portion 33 is close to the inner surface of the bore inside the bore. An O-ring 34 is fitted over the outer periphery of the jaw portion 33. The jaw portion 33 makes contact with the inner surface of the bore via the intervening O-ring 34. Consequently, it is possible to suppress lateral displacements of the retainer 32 and the $X_0$ shim coil 22 caused by a Lorentz force that the shim coil 22 undergoes when the shim coil is electrically energized within the magnet.

Figure 3:
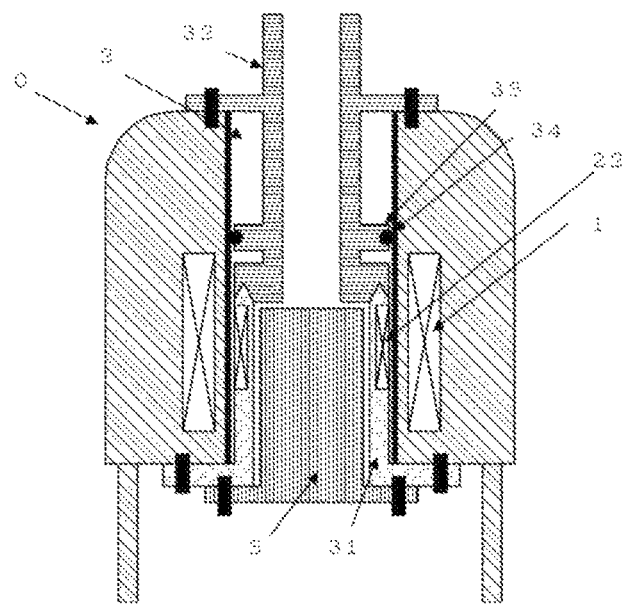
FIG. 3 is a vertical cross section of another configuration for mounting the $X_0$ shim coil in the bore of the superconducting magnet.

The second example applies to the case where the $X_0$ shim coil is mounted to the room-temperature shim unit. The cross section of FIG. 3 shows the manner in which the shim coil has been mounted to a magnet. In FIG. 3, the room-temperature shim unit 31 is inserted into the bore from the bore opening end at the bottom of the magnet, and the top end of the unit is located above the center of the magnetic field in the same way as in the configuration of FIG. 2. The shim unit is bolted to the lowermost flanged surface of the magnet at the flange at the lowermost end of the shim unit. In the present example, the room-temperature shim unit 31 is a part for supporting the $X_0$ shim coil 22. The shim coil 22 is secured to, and mechanically integrated with, the outer periphery of the room-temperature shim unit 31.

The NMR probe 3 is similar in configuration with that shown in FIG. 2. The retainer 32 is inserted into the bore 2 from the bore opening end at the top of the magnet in the same way as in the configuration of FIG. 2, but the retainer 32 acts as a part for holding the room-temperature shim unit 31 on which the $X_0$ shim coil 22 has been mounted in the present example. Furthermore, the retainer 32 has the jaw portion 33 in the same way as in the configuration of FIG. 2. The O-ring 34 is fitted over the outer periphery of the jaw portion 33. The jaw portion 33 makes contact with the inner surface of the bore via the intervening O-ring 34. Consequently, it is possible to suppress lateral displacements of the room-temperature shim unit 31 and the $X_0$ shim coil 22 caused by a Lorentz force that the shim coil 22 undergoes when the shim coil 22 is electrically energized within the magnet.

We have found that, when an additive magnetic field is set up in the x direction by the use of the $X_0$ shim coil configured as described above, deterioration of the magnetic field homogeneity in the space accommodating the sample due to the $X_0$ shim coil can be suppressed and thus the resolution can be suppressed from decreasing, by selecting the coil diameter and the coil length to be within a certain range of dimensional ratio.

This range of dimensional ratio between the coil diameter and the coil length that can suppress the magnetic field homogeneity in the space where the sample is present from deteriorating due to the $X_0$ shim coil is hereinafter described in detail. This shim coil is fabricated as a Helmholtz saddle coil of plural turns. In principle, the shim coil suffices to have at least one turn. Increasing the current fed to the coil has the same meaning as winding the same length of coil plural times.

The z component $B_z$ and x component $B_x$ of the magnetic field produced by the Helmholtz saddle coil of one turn composed of a thin conductor line are described on a step by step basis below. Also, the optimum range of the ratio between the coil height and the coil diameter of the $X_0$ shim coil which does not affect the resolution of NMR spectra is clarified.

(1) An analysis formula for the magnetic field components $B_z$ and $B_x$ is given.

(2) The dependence of $B_z$ and $B_x$ on the direction of the axis of sample spinning is clarified.

(3) The dependence of $B_z$ at sample ends on parameters regarding the dimensions and shape of the coil is clarified.

(4) The dependence of $B_x$ at the sample center on the parameters regarding the dimensions and shape of the coil is clarified.

(5) A ratio between $B_x$ and $B_z$ is taken based on the results of (3) and (4) above. Ranges of the parameters regarding the dimensions and shape of the coil are identified which satisfy the restrictive condition that the resolution of NMR spectra is not affected when an electric current required to achieve a necessary angular variation is supplied.

(6) A restrictive condition for the Helmholtz saddle coil of single turn and the ranges of the parameters regarding the dimensions and shape of the coil are identified.

In conducting these discussions, the dimensions of a superconducting magnet which will become major factors in restricting numerical values are described. Today, superconducting magnets for high-resolution NMR spectrometers having magnetic field strengths from few T to 20 T are sold commercially. These superconducting magnets are classified into two major categories according to the inside diameters of bores (bore sizes). For example, in the case of magnets available from JEOL RESONANCE Co., Ltd., bore inside diameters and inside diameters of room-temperature shim coils have dimensions as listed in Table 1 according to magnetic field strength.

TABLE 1

| Dimensions of narrow bores | | | | | |
|---|---|---|---|---|---|
| magnetic field strength (tesla) | 7 | 9.4 | 11.5 | 14 | 16.3 |
| $^1$H Lamor frequency (MHz) | 300 | 400 | 500 | 600 | 700 |
| inside diameter of bore (mm) | 54 | 54 | 54 | 54 | 54 |
| inside diameter of room-temperature shim coil (mm) | 41 | 41 | 41 | 41 | 41 |
| Dimensions of wide bores | | | | | |
| magnetic field strength (tesla) | 7 | 9.4 | 11.5 | 14 | 16.3 |
| $^1$H Lamor frequency (MHz) | 300 | 400 | 500 | 600 | 700 |
| inside diameter of bore (mm) | 89 | 89 | 89 | 89 | 89 |
| inside diameter of room-temperature shim coil (mm) | 73 | 73 | 73 | 73 | 73 |

Of these dimensions, at least the bore inside diameter is a standard shared among the three main NMR manufacturers (i.e., JEOL RESONANCE Co., Ltd., former Varian Associates, and Bruker Corporation). The bore size is available as a minimum size for securing magnetic field homogeneity over the sample space needed for NMR measurements or for securing a space in which mechanisms needed to make NMR measurements such as a sample spinning mechanism, a tuning and matching circuit (e.g., variable capacitors), and a sample temperature controlling mechanism are accommodated. It is considered that it is not necessary to conduct discussions on a possible magnet having a bore inside diameter greater than those of the wide bores. Accordingly, the following discussions are performed based on the above-described dimensional requirements.

(1) An Analysis Formula for the Magnetic Field Components $B_z$ and $B_x$ Produced by the Single-Turn Helmholtz Saddle Coil The single-turn Helmholtz saddle coil which is shown in FIG. 1 has a coil diameter of 2a smaller than the bore inside diameters of the commercially available superconducting magnets for high-resolution NMR spectrometers. The coil is arranged symmetrically vertically about the center O of the magnetic field. The magnetic field strength in the z direction applied by this coil to an arbitrary point P (z, R, Φ) within an internal space is given by the following analysis formula, the internal space being represented by a cylindrical coordinate system whose origin lies at the center O of the magnetic field:

$$B_z^A(P) = \frac{\mu_0 I}{4\pi} \int_{C_{up}} \frac{a R \cos(\phi' - \phi) - a^2}{[a^2 + R^2 + (z-l)^2 - 2a R \cos(\phi' - \phi)]^{3/2}} d\phi' + \quad (6)$$

$$\frac{\mu_0 I}{4\pi} \int C_{low} \frac{a R \cos(\phi' - \phi) - a^2}{[a^2 + R^2 + (z+l)^2 - 2a R \cos(\phi' - \phi)]^{3/2}} d\phi'$$

The integral ranges $C_{up}$ and $C_{low}$ are defined as follows. For $C_{up}$, $$A_1 = \left\{ Q(a, \phi', l) : \phi' = \left[ \frac{\pi}{2} - \alpha \to -\frac{\pi}{2} + \alpha \right] \right\} \quad (S1\text{-}1)$$

$$A_2 = \left\{ Q(a, \phi', l) : \phi' = \left[ \frac{\pi}{2} + \alpha \to -\frac{\pi}{2} - \alpha \right] \right\} \quad (S1\text{-}2)$$

where $C_{up} = A_1 + A_2$.

For $C_{low}$, $$A_3 = \left\{ Q(a, \phi', -l) : \phi' = \left[ -\frac{\pi}{2} + \alpha \to \frac{\pi}{2} - \alpha \right] \right\} \quad (S1\text{-}3)$$

$$A_4 = \left\{ Q(a, \phi', -l) : \phi' = \left[ \frac{3\pi}{2} - \alpha \to \frac{\pi}{2} + \alpha \right] \right\} \quad (S1\text{-}4)$$

where $C_{low} = A_3 + A_4$.

Since Eq. (6) contains elliptic integrals, it cannot be analytically written as a regular function.

$B_x$ (P) can be rewritten into the form:

$$B_x(P) = B_x^A(P) + \sum_{i=1}^{4} B_x^{Li}(P)$$

-continued $$B_x^A(P) = \frac{\mu_0 I}{4\pi} \int_{C_{up}} \frac{-a(z-l)\cos\phi'}{[a^2 + R^2 + (z-l)^2 - 2a\,lR\,\cos(\phi'-\phi)]^{3/2}} d\phi' + \quad (7)$$

$$\frac{\mu_0 I}{4\pi} \int_{C_{low}} \frac{-a(z+l)\cos\phi'}{[a^2 + R^2 + (z+l)^2 - 2alR\,\cos(\phi'-\phi)]^{3/2}} d\phi'$$

$$B_x^{Li}(P) = \frac{\mu_0 I}{4\pi} \frac{a\,\sin\phi_i' - R\,\sin\phi}{a^2 + R^2 - 2a\,R\,\cos\phi_i'} \times \quad (S2\text{-}5)$$

$$\left\{ \frac{l-z}{\sqrt{a^2 + R^2 - 2a\,R\,\cos(\phi_i'-\phi) + (l-z)^2}} + \right.$$

$$\left. \frac{l+z}{\sqrt{a^2 + R^2 - 2a\,R\,\cos(\phi_i'-\phi) + (l-z)^2}} \right\}$$

Note that the calculation range is defined as follows:

$$L_1 = \{Q(a, \phi_1', z'): \phi_1' = \frac{\pi}{2} - \alpha, z' = [-l \to l]\} \quad (S2\text{-}1)$$

$$L_2 = \{Q(a, \phi_2', z'): \phi_2' = \frac{\pi}{2} + \alpha, z' = [-l \to l]\} \quad (S2\text{-}2)$$

$$L_3 = \{Q(a, \phi_3', z'): \phi_3' = -\frac{\pi}{2} - \alpha, z' = [l \to -l]\} \quad (S2\text{-}3)$$

$$L_4 = \{Q(a, \phi_4', z'): \phi_4' = -\frac{\pi}{2} + \alpha, z' = [l \to -l]\} \quad (S2\text{-}4)$$

Especially, the magnetic field $B_x(0)$ lying in the x direction and at the center O of the magnetic field can be written as:

$$B_x(0) = \frac{2\mu_0}{\pi} \frac{I}{a} \frac{(2a^2 + l^2)l\,\cos\alpha}{(a^2 + l^2)^{3/2}} \quad (11)$$

Figure 4:
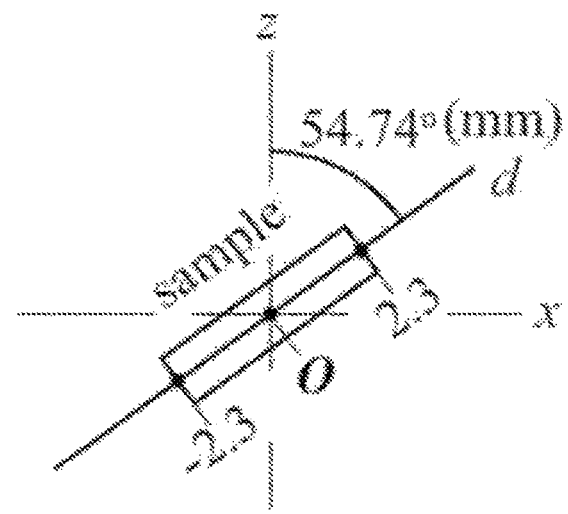
FIG. 4 is a diagram illustrating the definition of a coordinate axis d extending along the axis of spinning of a sample tube tilted at the magic angle relative to a static magnetic field.

In order to evaluate z component $B_z$ and x component $B_x$ of the magnetic field produced in the sample space of the superconducting magnet for a solid-state high-resolution NMR spectrometer by the single-turn Helmholtz saddle coil, a coordinate axis d extending along the axis of spinning of the sample tube tilted at the magic angle relative to the static magnetic field as shown in FIG. 4 is now defined anew as $$d:(1/\sqrt{3})z + (\sqrt{2}/\sqrt{3})x$$

Since the sample tube rotates about the axis d, the z direction and x direction components of the magnetic field produced by the single-turn Helmholtz saddle coil have a spread in the direction normal to the axis d. These magnetic field components in the sample space are averaged out by spinning of the sample. Consequently, only the magnetic field components at points on the axis d need to be taken into account. Thus, in the following evaluation, $B_z$ and $B_x$ are restricted to magnetic field components $B_z(d)$ and $B_x(d)$, respectively, at the points on the axis d.

The assessment scope on the axis d in the sample space is represented by $-d_{end} \leq d \leq d_{end}$, where $d_{end}$ is the distance from the center of sample O to an end of the sample. A value $d_{end} = 2.3$ mm is used herein as a typical value on the assumption that a sample tube used in a commercially available solid-state high-resolution NMR spectrometer has a length of 5 mm. Also assume that the position of the center of the sample lies at $d_0 = 0$ mm.

(2) Dependences of Magnetic Field Components $B_z$ and $B_x$ Produced by the Single-Turn Helmholtz Saddle Coils on Axis of Spinning d of the Sample Tube FIGS. 5A and 5B and FIGS. 6A and 6B are graphs obtained by calculating the magnetic field components $B_z$ and $B_x$ produced by the single-turn Helmholtz saddle coils using the above formula and plotting their dependences on the axis of spinning d of the sample tube. The current I=1 A. The half heights L of the coils are 35 mm and 89 mm, respectively. Two cases are presented here. In one case, the radius a=17.5 mm (FIGS. 5A and 5B) assuming a minimum value of design conditions that is taken "when the coil is installed within the probe in a narrow bore magnet". In the other case, the radius a=44.5 mm (FIGS. 6A and 6B) assuming a maximum value of design conditions that is taken "when a wide bore magnet is used and the coil is installed outside of the room-temperature shim coil (in other words, on the internal bore surface)".

It can be seen from FIGS. 5A and 6A that the dependence of the magnetic field component $B_x(d)$ is represented by an even function which maximizes at the sample center $d_0$, decreases at the sample ends $\pm d_{end}$, and is symmetric right and left in both cases.

It can be seen from FIG. 5A that the rate of decrease $(B_x(d_0) - B_x(d_{end}))/B_x(d_0)$ of $B_x(d)$ from the sample center $d_0$ to the sample ends $\pm d_{end}$ is $(B_x(d_0) - B_x(d_{end}))/B_x(d_0) = (49-46.5)/49 = 0.0510$ when the coil is installed inside the probe of the narrow bore magnet. Similarly, it is observed from FIG. 6A that the rate of decrease is $(B_x(d_0) - B_x(d_{end}))/B_x(d_0) = (19.3-19.1)/19.3 = 0.0104$ when the coil is installed outside the room-temperature shim unit in the wide bore. In this way, the rate of decrease is within about 5% at maximum. Consequently, the magnetic field component $B_x(d)$ can be regarded as uniform over the whole sample space.

On the other hand, it can be seen from FIGS. 5B and 6B that the magnetic field component $B_z(d)$ possesses a dependence represented by an even function which is symmetric right and left as a whole in both cases. This even function maximizes and is zero at the sample center $d_0$ and is nearly zero near the sample center ($-1$ mm$\leq d \leq +1$ mm). The difference between the maximum and minimum values of the magnetic field component $B_z(d)$ in the sample space, the difference being an index indicating the effect on the spectral resolution, i.e., $\Delta B_z(d) = B_z(d_{end}) - B_z(d_0) = B_z(-d_{end}) - B_z(d_0)$, is $\Delta B_z(d) = 1.25$ nT when it is installed inside the probe of the narrow bore magnet as can be seen from FIG. 5B. The difference is $\Delta B_z(d) = 0.0125$ nT when it is installed outside the room-temperature shim unit of the wide bore magnet, as can be seen from FIG. 6B.

Figure 7:
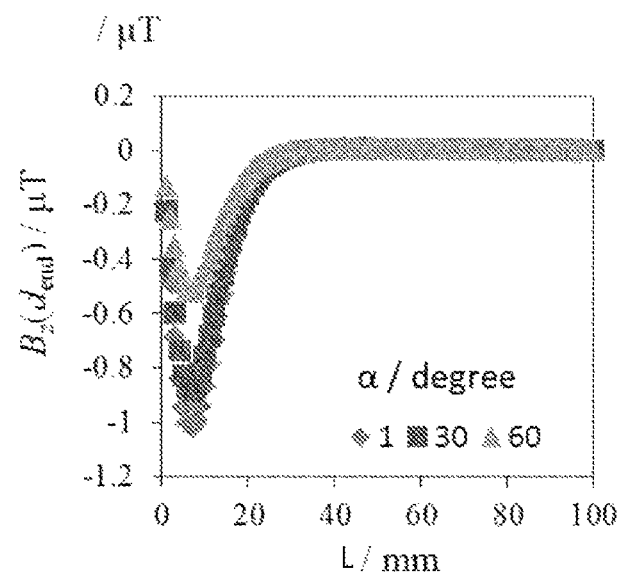
FIG. 7 is a graph in which the dependence of $B_z$ ($d_{end}$) on the coil half height L is plotted for various values of angular aperture α.
Figure 8:
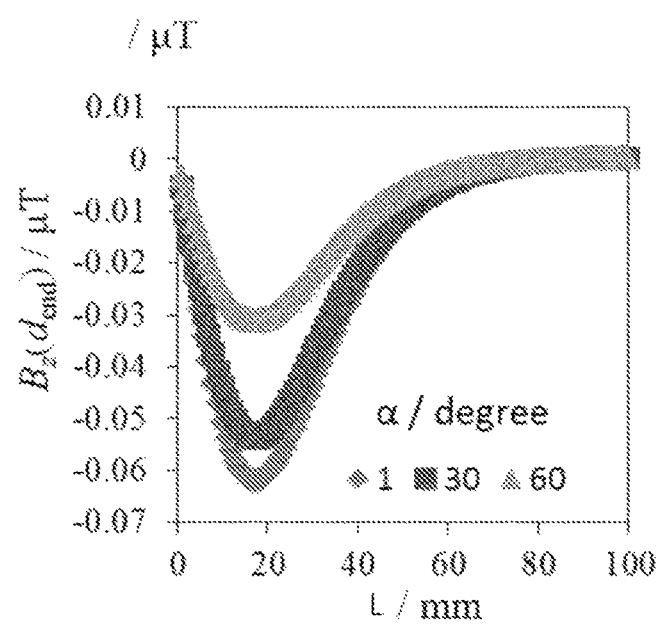
FIG. 8 is a graph in which the dependence of $B_z$ ($d_{end}$) on the coil half height L is plotted for various values of angular aperture α.

(3) Dependence of Magnetic Field Component $B_z(d_{end})$ Produced by Single-Turn Helmholtz Saddle Coil on Parameters Regarding Dimensions and Shape of Coil FIG. 7 is a graph obtained by plotting the dependence of the magnetic field component $B_z(d_{end})$ on the coil half height L for values of the angular aperture $\alpha$ when the coil is installed inside the probe of the narrow bore magnet (2a=35 mm) in a corresponding manner to the minimum value of the set range of the coil diameter 2a, based on Eq. (6). FIG. 8 is a graph obtained by plotting the dependence of the magnetic field component $B_z(d_{end})$ on the coil half height L for values of the angular aperture $\alpha$ when the coil is installed outside of the room-temperature shim unit of the wide bore magnet (2a=89 mm) in a corresponding manner to the maximum value of the set range of the coil diameter 2a, based on Eq. (6). It is assumed that current I=1 A.

Figure 9:
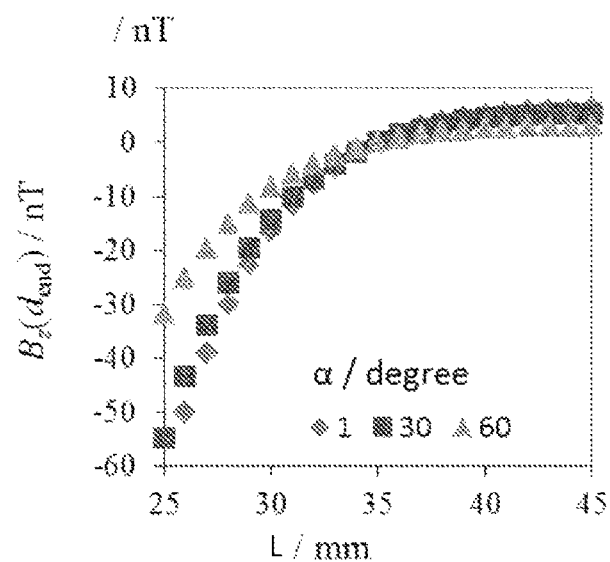
FIG. 9 is an enlarged view of the vicinities of a point of the graph of FIG. 7 in which the magnetic field strength is zero.
Figure 10:
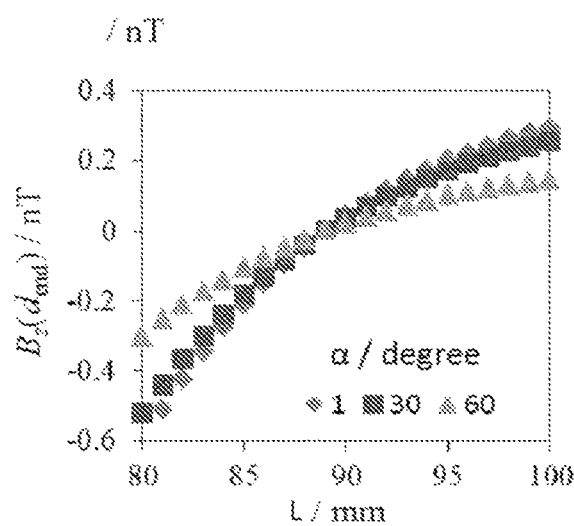
FIG. 10 is an enlarged view of the vicinities of a point of the graph of FIG. 8 in which the magnetic field strength is zero.

FIGS. 9 and 10 are enlarged views of vicinities of values at which the magnetic field strength is zero in the graphs of FIGS. 7 and 8, respectively.

It can be seen from FIGS. 9 and 10 that $B_z(d_{end})$ has a value of L at which $B_z(d_{end})$ is always zero irrespective of both the value of the radius a and the value of the angular aperture α. This is called the zero-crossing point (L=L$_0$). Also, in the immediate vicinity of the zero-crossing point, the strength of the $B_z(d_{end})$ hardly varies regardless of the value of the angular aperture α.

Figure 11:
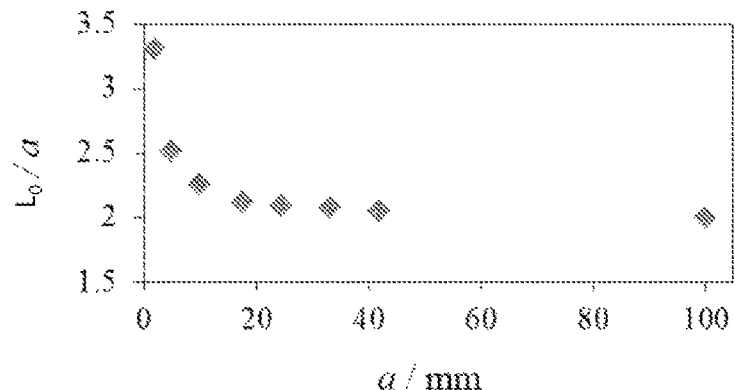
FIG. 11 is a graph in which the dependence of zero-crossing ratio $L_0$/a on a is plotted.

To manifest the relationship between the zero-crossing point L$_0$ and the radius a, the dependence of the zero-crossing point L$_0$/a on a is plotted. The result is shown as a graph in FIG. 11. The zero-crossing point L$_0$/a has such a property that its value approaches 2 with increasing the value of the coil radius a. Within the range (17.5 mm≤a≤44.5 mm) of the bore sizes of the commercially available superconducting magnets for high-resolution NMR spectrometers, the values of the zero-crossing point L$_0$/a are confined to within 2.0 to 2.2.

Figures 12A, 12B:
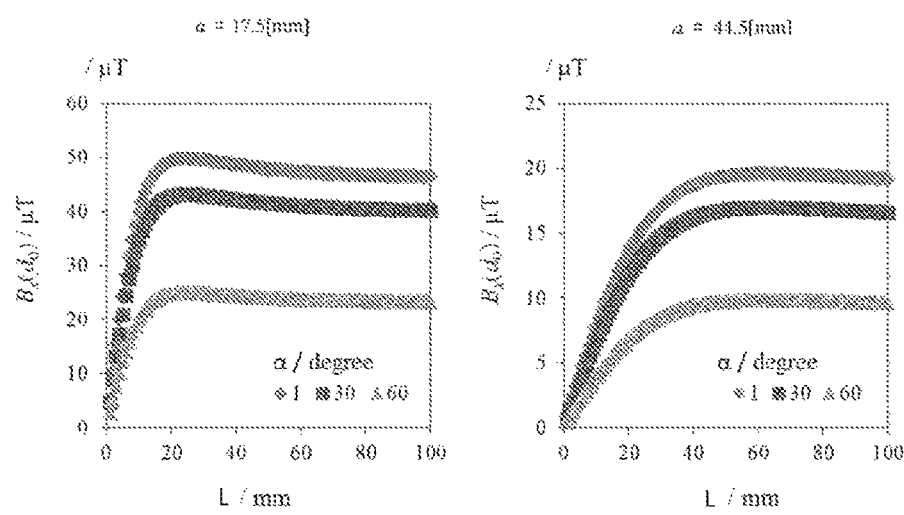
FIGS. 12A and 12B show graphs in which the dependence of $B_x$ ($d_0$) on the coil half height L is plotted for various values of angular aperture α.

(4) Dependence of Magnetic Field Component $B_x$ (d0) Produced by the Single-Turn Helmholtz Saddle Coil on the Parameters Regarding Dimensions and Shape of Coil FIGS. 12A and 12B are graphs obtained by plotting the dependence of the magnetic field component $B_x(d_0)$ on the coil half height L for values of the angular aperture α and for the previously assumed minimum value 17.5 mm and maximum value 44.5 mm of the set range of the coil radius a, based on Eq. (11). It is assumed that current I=1 A.

As is well known, in the case of a single-turn Helmholtz saddle coil, the magnetic field component $B_x(d_0)$ assumes its maximum value at L=√2a. The magnetic field component $B_x(d_0)$ has a dependence in the form of cos α on the angular aperture α.

(5) Range of Ratio Between Coil Height and Coil Diameter that the Single-Turn Helmholtz Saddle Coil can Assume and that does not Affect the Resolution of NMR Spectra when an Electric Current Needed to Achieve an Angular Variation is Supplied On the condition that, when the single-turn Helmholtz saddle coil performs its angle adjusting function, the resolution of NMR spectra is not affected, conditions impressed on the dimensions and shape of the coil are found as follows.

Where the axis of sample spinning is tilted at angle θ in the x direction relative to the z direction static magnetic field B$_0$ having an arbitrary strength, when the angle θ is varied by superimposing a uniform magnetic field of an arbitrary strength in the x direction to produce a combined static magnetic field B$_0$', if error occurring in mechanically setting the magic angle in a conventional manner is taken into account, it is considered that ±0.05° at minimum is necessary as a range of variable angular angle for θ. The strength of a uniform magnetic field in the x direction produced by the single-turn Helmholtz saddle coil necessary to secure this variable range is $|B_x(d_0)| \leq B_0 * |\tan(\pm 0.05°)|$. Therefore, $|B_x(d_0)| \leq 0.000872 * B_0$.

On the other hand, the strength of the z direction magnetic field generated by the single-turn Helmholtz saddle coil that does not affect the resolution of solid-state high-resolution NMR spectra is on the order of 0.01 ppm of the external static magnetic field. Therefore, $|B_z(d_{end})| \leq 0.00000001 * B_0$.

Therefore, the ratio of the permissible strength $|B_z(d_{end})|$ of the z direction magnetic field produced by the single-turn Helmholtz saddle coil having a variable angular range of ±0.05° to the strength of the x direction magnetic field $|B_x(d_0)|$ is $|B_z(d_{end})/B_x(d_0)| \leq 0.0000115$ irrespective of the strength of the external magnetic field.

As described previously, the magnetic field component $B_z$ does not depend on the value of the angle α near the zero-crossing point. On the other hand, the magnetic field component $B_x$ depends on the angle α ($B_x = B_x^\alpha(d)$).

Thus, the range to be found is the condition which maximizes the ratio $|B_z(d_{end})/B_x^\alpha(d_0)|$ for α.

Since $|B_z(d_{end})/B_x^\alpha(d_0)| = |B_z(d_{end})/B_x^{\alpha=0}(d_0)| * |\cos(0)/\cos \alpha|$, we have $|B_z(d_{end})/B_x^{\alpha=0}(d_0)| \leq 0.0000115 * |\cos \alpha|$. Because $|\cos \alpha| \leq 1$, the relationship, $|B_z(d_{end})/B_x^{\alpha=0}(d_0)| \leq 0.0000115$, holds. This is a maximum allowable restrictive condition.

Figure 13A:
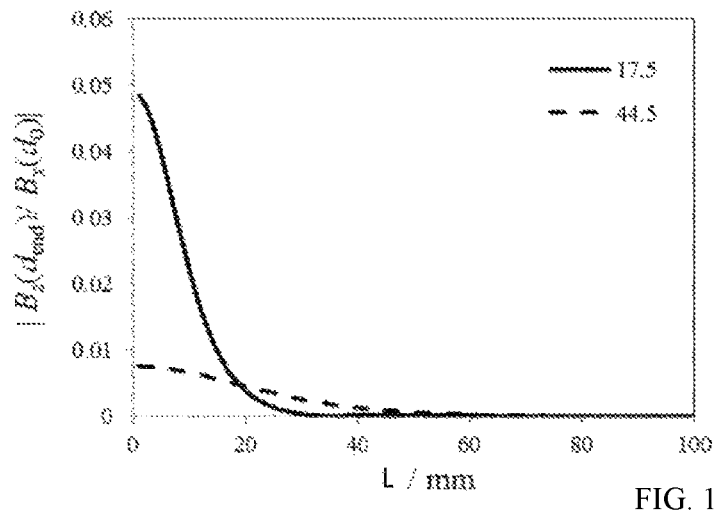
FIGS. 13A and 13B show graphs in which the dependence of $|B_z (d_{end})/B_x (d_0)|$ on the coil half height L is plotted for a=17.5 mm and a=44.5 mm.
Figure 13B:
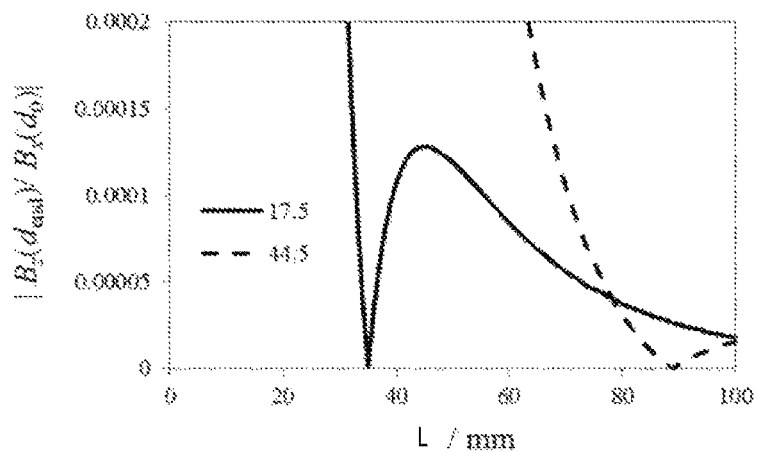

FIGS. 13A and 13B are graphs obtained by plotting the dependence of $|B_z(d_{end})/B_x(d_0)|$ on the coil half height L on the assumption that α=1° for α=17.5 mm and α=44.5 mm, respectively, corresponding to the previously described minimum and maximum values of the set range of the coil radius a. FIG. 13B is a plot obtained by magnifying the vertical scale of the graph of FIG. 13A 300 times.

It can be noted from FIGS. 13A and 13B that the relationship, $|B_z(d_{end})/B_x(d_0)| = 0$, holds at the zero-crossing point L$_0$ (~2a) irrespective of the radius a, as a matter of course.

Based on these graphs, the range of L that satisfies the restrictive condition is now discussed in connection with the lower and upper limit values of the radius a. When a=17.5 mm, the relationship 34.75 mm L 35.3 mm holds, i.e., 1.99≤2L/2a≤2.02. When a=44.5 mm, the relationship 85 mm≤L≤95.5 mm holds, i.e., 1.91≤2L/2a≤2.15.

Accordingly, within the range (17.5 mm≤a≤44.5 mm) of bore sizes of commercially available superconducting magnets for high-resolution NMR spectrometers, under the above-described restrictive condition (i.e., the effect on the resolution within the variable range of ±0.05° is equal to or less than 0.01 ppm), a minimum restrictive condition imposed on the shape of the single-turn Helmholtz saddle coil is given by 1.91≤2L (coil height)/2a (coil diameter)≤2.15 regarding the coil height 2L and the coil diameter 2a. Especially, where a=17.5 mm is approached, it is desired to satisfy 1.99≤2L/2a≤2.02.

(6) Restrictive Conditions of Plural-Turn Helmholtz Saddle Coil and Restriction of Range of Parameters Regarding Dimensions and Shape of the Coil In the foregoing items (1)-(5), a single-turn Helmholtz saddle coil has been discussed. Of course, it is possible to adopt a single-turn Helmholtz saddle coil in practice. It is quite conceivable that plural turns are used to reduce the required current.

In this case, coils with exactly the same dimensions cannot be wound in actuality at exactly the same position plural times. Therefore, where a Helmholtz saddle coil having plural turns is formed on a cylindrical bobbin, the coil diameter 2a does not vary but the height 2L and the angular aperture α of the coil change with each turn.

In view of the foregoing, within the range of the bore sizes of commercially available superconducting magnets for high-resolution NMR spectrometers (i.e., 17.5 mm≤a≤44.5 mm), under the above-described restrictive condition (i.e., the effect of the variable angular range of ±0.05° on the resolution is equal to or less than 0.01 ppm), maximum allowable design conditions for a plural-turn Helmholtz saddle coil are to satisfy the above-described relationship, i.e., 1.91≤2L(coil height)/2a(coil diameter)≤2.15 or 1.99≤2L(coil height)/2a(coil diameter)≤2.02 irrespective of the magnitude of the angular aperture α, where 2a is the coil diameter and 2L is the coil height of at least one of the conductor lines constituting the plural-turn Helmholtz saddle coil.

Example

Figure 14:
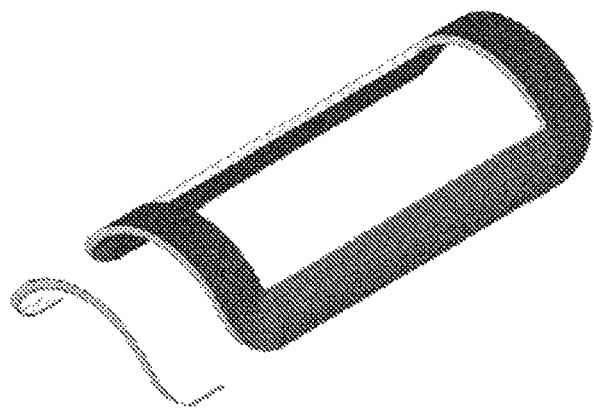
FIG. 14 is a perspective view of an $X_0$ shim coil alone, the coil being fabricated according to the present invention, showing the shape of the shim coil.
Figure 15:
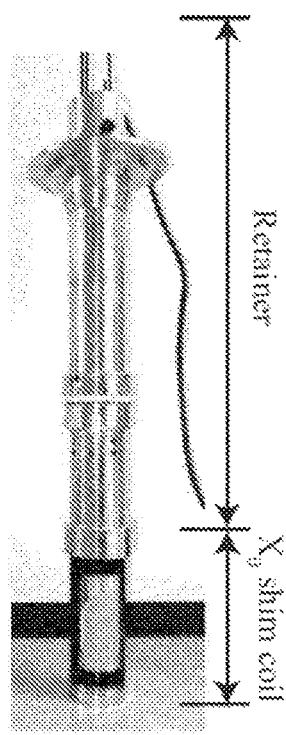
FIG. 15 shows the manner in which the $X_0$ shim coil shown in FIG. 14 has been mounted to a retainer for a wide bore magnet.

An $X_0$ shim coil was created based on the optimum range derived by us as described in this way. The shape of this shim coil alone is shown in FIG. 14. FIG. 15 is a photograph showing a state in which the shim coil has been mounted to a retainer for a wide bore magnet.

The coil has dimensions and shape as described below.

conductor line material: coated rectangular copper wire having a width of 2.6 mm and a thickness of 0.3 mm, coil diameter (inside diameter 2a) of 66.3 mm, coil height (2L) ranging from a maximum height of 157.2 mm (outermost turn) to a minimum height of 123.6 mm (innermost turn)

angular aperture (2α) ranging from a maximum value of 70° (innermost turn) to a minimum value of 10° (outermost turn)

The set of equipment of FIG. 15 was inserted from the top bore opening end of the superconducting magnet to place the $X_0$ shim coil into the center of the magnetic field. Furthermore, an NMR probe (MAS probe) was inserted from the bottom of the magnet and held, thus resulting in the structure of FIG. 3.

The $X_0$ shim coil was connected with a commercially available current regulated power supply (PBX20-20 manufactured by KIKUSUI ELECTRONICS CORPORATION, Japan). An operation for adjusting the angle within the range ±0.05° was performed. During this adjusting operation, the effect on the resolution of NMR spectra was experimentally validated.

NMR experiments were conducted using a wide bore superconducting magnet (for a high-resolution NMR spectrometer) having a magnetic field strength of 7 T (manufactured by JASTEC (JAPAN SUPERCONDUCTOR TECHNOLOGY, INC.)), a self-produced OPENCORE (open-source core) spectrometer, a commercially available room-temperature shim unit manufactured by JEOL Ltd., and a commercially available MAS probe manufactured by Doty Scientific. Carrier frequencies were $^1$H: 301.4 MHz and $^{13}$C: 75.8 MHz, respectively, for nuclei to be observed.

The angle was adjusted in the following procedure.

(1) A powdered KBr sample was sealed in a sample tube and set in the sample spinning mechanism of the MAS probe.

(2) An NMR free induction decay (FID) signal of $^{79}$Br of KBr was observed while spinning the powdered KBr sample at spin rates of several kHz to tens of kHz. A rotational echo signal was observed in the FID signal according to the period of the rotation. This rotational echo signal arises from internal interactions in KBr (in this case, anisotropy of bulk molecular magnetic susceptibility occurring at the interfaces of crystallites within the powder) and exhibits a substantial dependence represented by a Legendre function $P_2(\cos θ')=(3\cos θ'^2-1)/2$ on a substantial tilt angle θ'.

(3) If the substantial tilt angle θ' made between a composite static magnetic field and the axis of sample spinning is a non-magic angle (θ'≠arc cos (1/√3), i.e., $P_2(\cos θ')≠0$), the effects of internal interactions are superimposed on the rotational echo signal. Consequently, an NMR free induction signal of $^{79}$Br is observed at an accelerated decay rate.

If the substantial tilt angle θ' is set exactly to the magic angle, the effects of internal interactions on the rotational echo are minimized. As a result, an NMR free induction signal of $^{79}$Br is observed at the slowest decay rate.

(4) The substantial tilt angle θ' is set to the magic angle by adjusting the current fed to the $X_0$ shim coil while observing a free induction decay signal until the decay rate of the free induction decay signal becomes lowest.

A sample used for adjustment of the magic angle is not restricted to KBr. An appropriate substance has internal interactions which exhibit a dependence represented by a Legendre function $P_2(\cos θ)=(3\cos θ^2-1)/2$ on the tilt angle θ of the axis of sample spinning relative to the static magnetic field and which provide good measurement sensitivity. For example, using a powdered sample of an organic compound including heavy hydrogen, a rotational echo signal from internal interactions (in this case, quadrupolar interactions) is observed in the same way as in the above-described process and employed for adjustment of the magic angle.

In the above example, an adjustment is made while observing a free induction decay signal such that the decay rate of the free induction decay signal becomes lowest. Alternatively, an adjustment may be made by observing an NMR spectrum obtained by Fourier transforming a free induction decay signal. That is, the substantial tilt angle θ' can be set to the magic angle by adjusting the current flowing through the $X_0$ shim coil so as to maximize the spinning sidebands appearing in an NMR spectrum.

Figure 16:
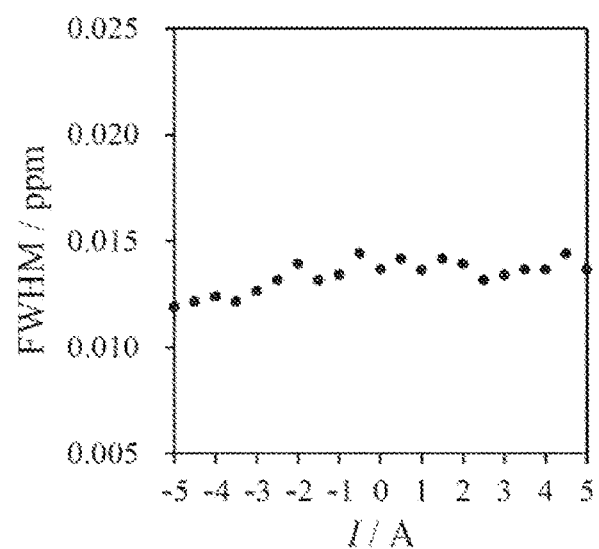
FIG. 16 is a graph in which the $^1$H-NMR spectral linewidth of aqueous solution of cupric sulfate is plotted, the linewidth being observed when the $X_0$ shim coil shown in FIG. 15 is used while varying the current supplied into the shim coil over its full range.

FIG. 16 is a graph obtained by plotting linewidths observed with $^1$H-NMR of aqueous solution of cupric sulfate when the current supplied to the $X_0$ shim coil shown in FIG. 15 was varied over the whole variable range of 0.05°. When the present $X_0$ shim coil is used under a magnetic field of 7 T, a variable range of current I=±5 A is equivalent to a variable angular range of ±0.05°.

It is seen from FIG. 16 that the linewidths of resonance lines are within a range from 0.012 ppm to 0.015 ppm over the whole variable angular range, thus satisfying the condition "the effect on the resolution is equal to or less than 0.01 ppm".

Figure 17:
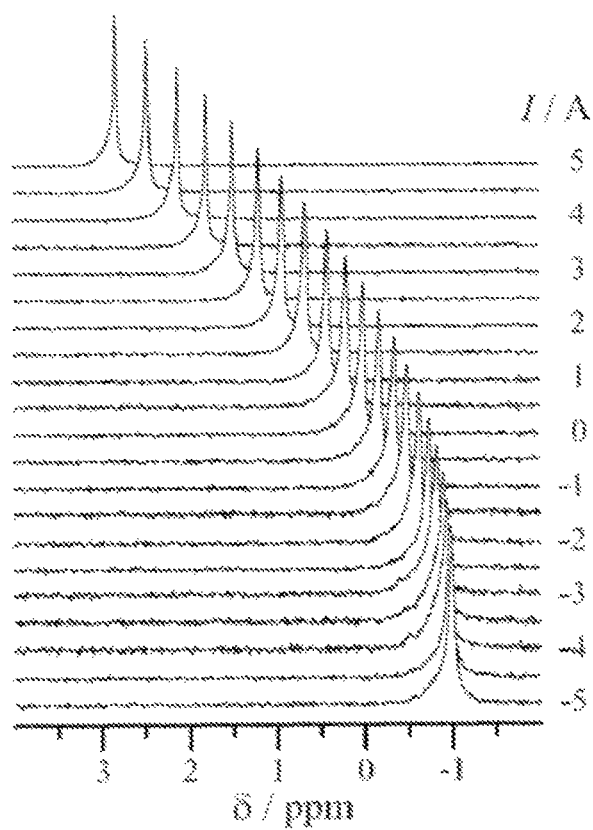
FIG. 17 shows variations in a $^{13}$C-NMR (CPMAS NMR) spectrum of adamantane observed when the $X_0$ shim coil shown in FIG. 15 is used while varying the current supplied into the shim coil over its full range.
Figure 18:
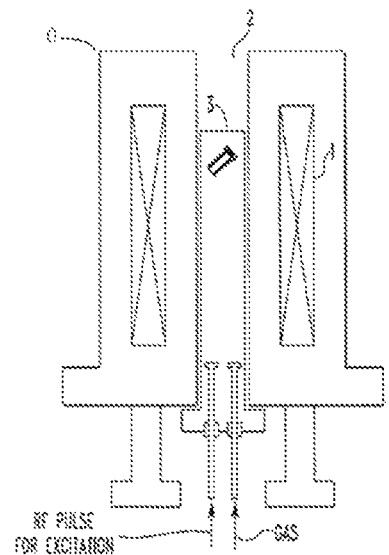
FIG. 18 is a schematic representation of a conventional solid-state high-resolution NMR apparatus.
Figure 19:
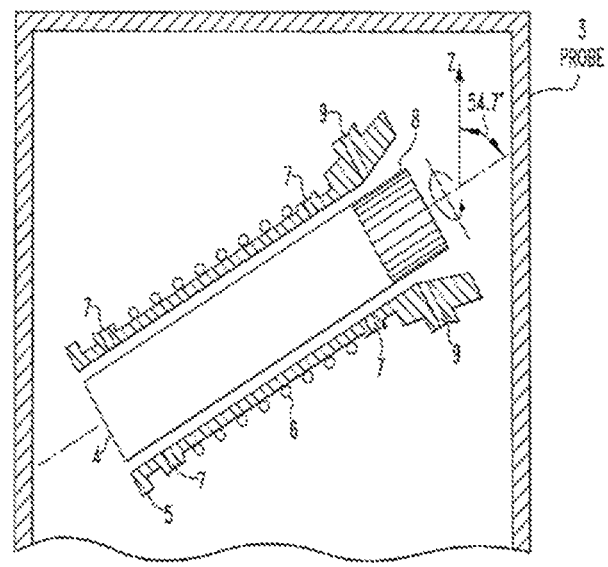
FIG. 19 is a cross-sectional view of a sample spinning mechanism for usable in the apparatus shown in FIG. 18.
Figure 20:
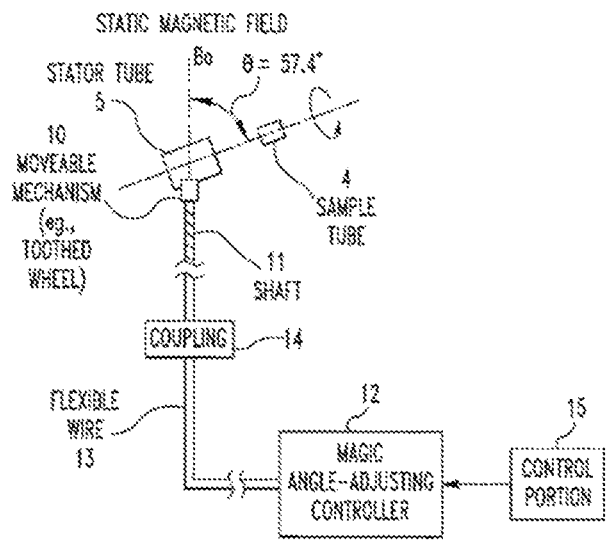
FIG. 20 is a schematic representation of one example of a mechanism for mechanically adjusting the axis of sample spinning to the magic angle relative to the direction of a static magnetic field.

FIG. 17 shows variations in a $^{13}$C-NMR (CPMAS) spectrum of adamantane observed similarly when the current supplied into the $X_0$ shim coil shown in FIG. 15 is varied over its full range of ±0.05°.

The present invention yields the following advantages. Conventionally, the magic angle has been adjusted by mechanically adjusting the tilt angle of the axis of sample spinning. There are many items to be considered in association such as the dimensional accuracy and assembly accuracy of parts bearing the mechanical adjusting means (such as backlash of gears), and the accuracy at which a probe is installed when the probe is placed in a magnetic field by a user. Consequently, it has been difficult to adjust the magic angle at an accuracy of at least within 0.01°.

In recent years, solid-state high resolution NMR spectroscopy has found wider application especially in inorganic substances. Many inorganic nuclides possess interactions of relatively large anisotropies (such as quadrupolar interactions and chemical shift interactions), and accurate adjustment of the magic angle can be made easily. This further extends the applicability to these areas of technology and promotes routinization of measurements. Especially, the high-sensitivity ST MAS (Satellite-transition MAS) technique that permits splitting of quadrupolar and chemical shift interactions is required to set the magic angle at a high accuracy of within 0.008° for a quadrupolar coupling constant at 2.4 MHz. Hence, in this method, the measurement conditions are quite difficult to set.

Patent document 1 has been proposed in an attempt to solve this problem by electrically adjusting the direction of a static magnetic field using an $X_0$ shim coil instead of mechanically adjusting the tilt angle of the axis of sample spinning.

However, in the technique of patent document 1, the effects of the $X_0$ shim coil on the resolution of NMR spectra have not been discussed sufficiently. The present invention permits accurate control of the magic angle using the $X_0$ shim coil without impairing the resolution of NMR signals by offering an optimum range of the dimensional ratio of the $X_0$ shim coil.

What is claimed is:

1. A solid-state NMR apparatus comprising:
   a magnet for producing an external static magnetic field $B_0$ extending along a z axis;
   a probe arranged to support a sample tube in the external static magnetic field $B_0$ so that an axis of the sample tube is tilted at a magic angle relative to the static magnetic field $B_0$ and spin the sample tube about the tilted axis at high speed;
   a coil assembly used for accurate adjustment of the magic angle and arranged around the probe arranged to produce a uniform magnetic field in the direction of an x axis when the axis of spinning of the sample is tilted relative to the z axis within a z-x plane;
   wherein said coil assembly comprises a pair of Helmholtz saddle coils arranged symmetrically with respect to the z axis of an xyz coordinate system on a cylindrical plane having a radius of a and being centered at the z axis, and each of the Helmholtz saddle coils being made of at least one turn of coil;
   wherein the at least one turn of coil is composed of a pair of arcuate conductor lines arranged circumferentially of the cylindrical plane and a pair of straight conductor lines interconnecting the arcuate conductor lines and arranged lengthwise of the cylindrical plane, each of the arcuate conductor lines having a diameter of 2a, each of the straight conductor lines having a length of 2L; and
   wherein the diameter 2a of each of the arcuate conductor lines and the length 2L of each of the straight conductor lines are so selected as to satisfy the following relationship:

$1.91 \leq 2L/2a \leq 2.15$.

2. The solid-state NMR apparatus as set forth in claim 1, wherein the diameter 2a of each of said arcuate conductor lines and the length 2L of each of said straight conductor lines are so selected as to satisfy the following relationship:

$1.99 \leq 2L/2a \leq 2.02$.

3. A method of adjusting the magic angle in the solid-state NMR apparatus as set forth in claim 1, said method comprising the steps of:
   placing a sample tube within an external static magnetic field $B_0$;
   making an NMR measurement while spinning the sample tube at high speed about an axis tilted at a given angle relative to the external static magnetic field $B_0$ and at the same time varying an electric current supplied into the coil assembly;
   detecting an NMR signal;
   finding a state in which a rotational echo signal appearing in the detected NMR signal decays most slowly;
   taking the electric current supplied into the coil assembly under this found state as an optimum current; and
   supplying this optimum current into the coil assembly.

4. A method of adjusting the magic angle in the solid-state NMR apparatus as set forth in claim 1, said method comprising the steps of:
   placing a sample tube within an external static magnetic field $B_0$;
   making an NMR measurement while spinning the sample tube at high speed about an axis tilted at a given angle relative to the external static magnetic field $B_0$ and at the same time varying an electric current supplied into the coil assembly;
   detecting an NMR signal;
   generating an NMR spectrum based on the detected NMR signal;
   finding a state in which spinning sidebands appearing in the NMR spectrum maximize;
   taking the electric current supplied into the coil assembly under this found state as an optimum current; and
   supplying this optimum current into the coil assembly.

* * * * *